United States Patent
Radhakrishnan et al.

(10) Patent No.: US 11,782,791 B2
(45) Date of Patent: Oct. 10, 2023

(54) SYSTEM AND METHOD FOR MEMORY HANG RECOVERY USING A DISTRIBUTED POWER MANAGEMENT SYSTEM

(71) Applicant: Western Digital Technologies, Inc., San Jose, CA (US)

(72) Inventors: Rohith Radhakrishnan, Pulau Pinang (MY); Alvin Capili Gomez, Penang (MY); Aashish Sangoi, Chennai (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/411,770

(22) Filed: Aug. 25, 2021

(65) Prior Publication Data

US 2023/0066185 A1    Mar. 2, 2023

(51) Int. Cl.
| | |
|---|---|
| G06F 11/00 | (2006.01) |
| G06F 11/14 | (2006.01) |
| G06F 11/30 | (2006.01) |
| G06F 11/34 | (2006.01) |
| G06F 1/28 | (2006.01) |

(52) U.S. Cl.
CPC ............ *G06F 11/1441* (2013.01); *G06F 1/28* (2013.01); *G06F 11/3034* (2013.01); *G06F 11/3062* (2013.01); *G06F 11/3495* (2013.01); *G06F 2201/805* (2013.01)

(58) Field of Classification Search
CPC ............. G06F 11/1441; G06F 11/3034; G06F 11/3062; G06F 11/3495; G06F 1/28
See application file for complete search history.

(56) References Cited

U.S. PATENT DOCUMENTS

| | | | | |
|---|---|---|---|---|
| 5,847,586 A * | 12/1998 | Burstein | .............. | H03K 17/223 327/143 |
| 6,959,399 B2 * | 10/2005 | King | .................... | G11B 25/043 713/324 |
| 10,846,160 B2 * | 11/2020 | Chou | .................. | G06F 11/1438 |
| 2004/0021577 A1 * | 2/2004 | Lelecas | ................ | G08B 21/185 340/654 |
| 2006/0236198 A1 * | 10/2006 | Lintz | .................... | G06F 11/0781 714/E11.133 |
| 2009/0080279 A1 * | 3/2009 | Kim | ..................... | H01L 25/0657 257/691 |
| 2010/0199040 A1 * | 8/2010 | Schnapp | ............. | G06F 12/0891 711/170 |
| 2013/0086416 A1 * | 4/2013 | Kopylovitz | ......... | G06F 11/0727 714/6.11 |
| 2014/0320139 A1 * | 10/2014 | Renforth | ................ | G01R 31/11 324/415 |

(Continued)

*Primary Examiner* — Elmira Mehrmanesh
(74) *Attorney, Agent, or Firm* — Michael Best & Friedrich LLP

(57) ABSTRACT

A data storage device includes a non-volatile memory device including a memory block having a number of arrays, a number of power regulators, and a controller coupled to the non-volatile memory device. The arrays include a number of memory devices. A first array is determined to be in a non-responsive condition and a power regulator supplying power to the first array is instructed to cycle power to the first array. After the power to the first array has been cycled, a determination is made as to whether the first array is in a responsive condition.

17 Claims, 4 Drawing Sheets

(56) References Cited

U.S. PATENT DOCUMENTS

| | | | |
|---|---|---|---|
| 2016/0132394 A1* | 5/2016 | Niewczas | G06F 11/1441 |
| | | | 714/6.22 |
| 2017/0185495 A1* | 6/2017 | Jau | G06F 1/28 |
| 2019/0333550 A1* | 10/2019 | Fisch | G11C 11/4074 |
| 2021/0349782 A1* | 11/2021 | Ki | G06F 3/0634 |
| 2021/0407572 A1* | 12/2021 | Song | H01L 25/16 |
| 2023/0046912 A1* | 2/2023 | Veches | G11C 5/025 |

\* cited by examiner

SYSTEM AND METHOD FOR MEMORY HANG RECOVERY USING A DISTRIBUTED POWER MANAGEMENT SYSTEM

FIELD

This application relates generally to data storage devices, and more particularly, to data storage devices with multiple memory die power supplies.

BACKGROUND

Memory devices may experience a memory hang condition wherein one or more memory dies within the memory device become non-responsive. These memory hang situations may occur during read or write operations, wherein the die is unable to read or write the requested data. This can result in the memory device timing out and initiating a fault. The faults can cause the memory device to boot to a read only ("ROM") mode or other corrupted memory modes, possibly resulting in data loss. Furthermore, when a fault occurs due to a memory hang, the memory device may only be able to be repaired by the manufacturer, which generally results in the memory device becoming unusable (e.g., "bricked") for a user.

SUMMARY

Non-responsive memory dies within a non-volatile memory device often result in a failure of the entire memory device. Current designs have a single power supply for all memory dies, requiring power to be removed to all memory dies when a restart is attempted to resolve a non-responsive memory die issue, which may result in a boot into a ROM or corrupted data mode. By separating the memory dies into multiple arrays, each with their own power supply, a single array may be power cycled, while the remaining arrays handle all of the active operations and commands. This can allow for the memory device to continue operation while attempting to reset a non-responsive die, thereby reducing the need for the entire memory device to be repaired or replaced.

One embodiment of the present disclosure includes a data storage device including a non-volatile memory device including a controller and a memory block. The memory block includes a number of arrays, wherein each array includes a number of memory dies, and a number of power regulators. Each array of the plurality of arrays is coupled to one of the number of power regulators. The controller is configured to determine a first array of the number arrays is in a non-responsive condition, instruct a first power regulators of the number of power regulators providing power to the first array to cycle power to the first array in response to determining that the first array is in the non-responsive condition, and determine whether the first array is in a responsive condition in response to the first power supply cycling power to the first array.

Another embodiment of the present disclosure includes a method performed by a data storage device having a controller coupled to a non-volatile memory device. The method includes determining that a first array of a plurality of arrays is in a non-responsive condition, wherein the plurality of arrays include one or more memory dies. The method further includes cycling power to the first array in response to determining that the first array is in the non-responsive condition and maintaining power to at least a second array of the plurality of arrays while cycling power to the first array. The method also includes determining whether the first array is in a responsive condition in response to cycling power to the first array.

Another embodiment of the present disclosure includes an apparatus including means for determining that a first array of a plurality of arrays within a memory block is in a non-responsive condition, wherein the plurality of arrays include one or more memory dies. The apparatus further includes means for cycling power to the first array in response to determining that the first array is in the non-responsive condition. The apparatus also includes means for determining whether the first array is in a responsive condition in response to cycling power to the first array.

Various aspects of the present disclosure provide for data storage devices with multiple array power supplies to mitigate the effect of a non-responsive memory die. The present disclosure can be embodied in various forms, including hardware or circuits controlled by software, firmware, or a combination thereof. The foregoing summary is intended solely to give a general idea of various aspects of the present disclosure and does not limit the scope of the present disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the controller can be performed by hardware (for example, analog or digital circuits), a combination of hardware and software (for example, program code or firmware stored in a non-transitory computer-readable medium that is executed by a processor or control circuitry), or any other suitable means. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, MRAM, DRAM, etc.

Figure 1:
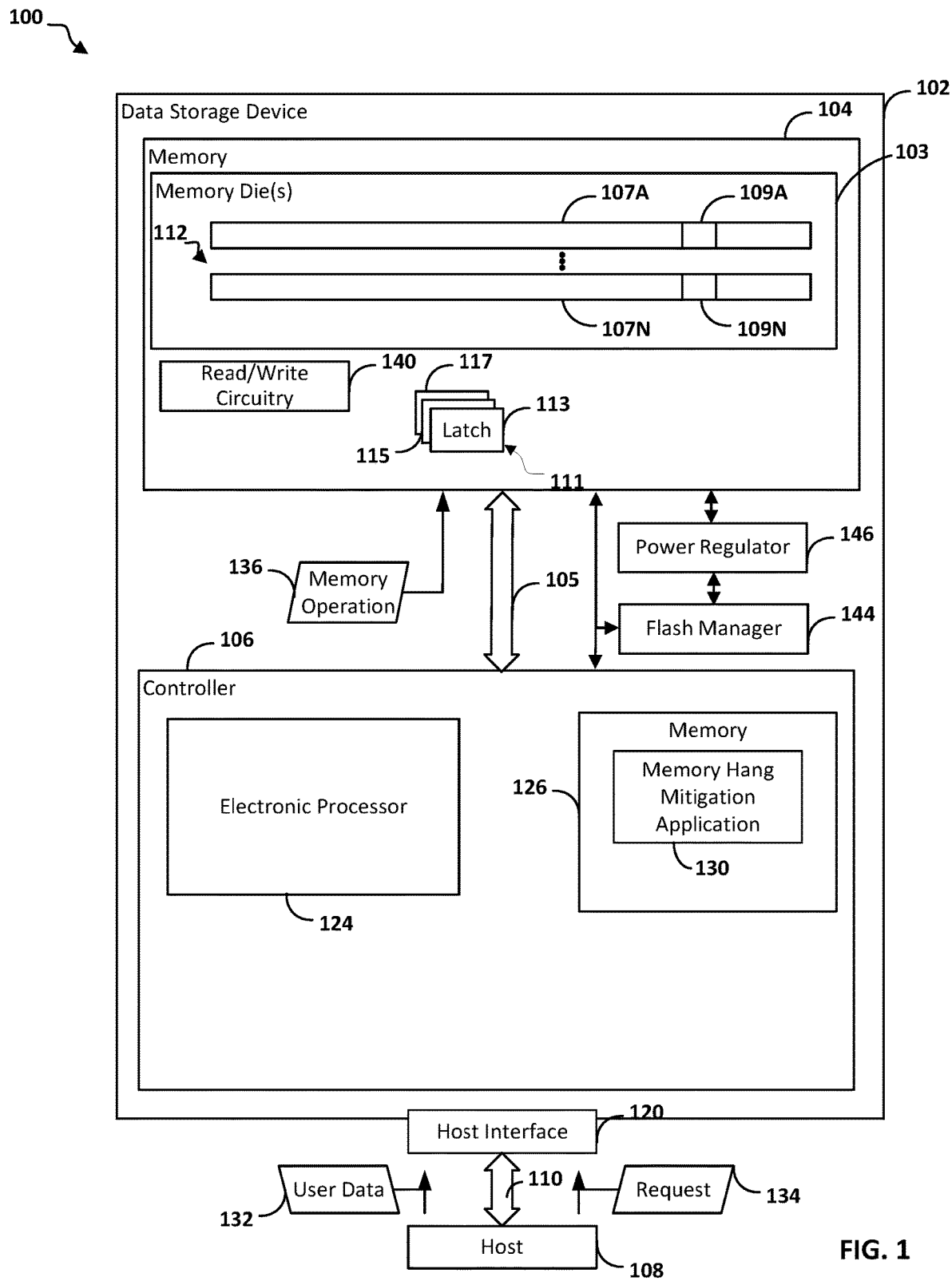
FIG. 1 is a block diagram illustrating one example of a system including a data storage device, according to some embodiments.

FIG. 1 is a block diagram of one example of a system 100 that includes memory hang mitigation features, in accordance with some embodiments of the disclosure. In the example of FIG. 1, the system 100 includes a data storage device 102 in communication with a host device 108. The data storage device 102 includes one or more memory devices 104 (e.g. non-volatile memory) that is coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled through a connection (e.g., a communication path 110), such as a bus or a wireless connection. In some examples, the data storage device 102 may be embedded within the host device 108. Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, a cloud storage drive, or other suitable storage drives.

The data storage device 102 may be configured to be coupled to the host device 108 using the communication path 110, such as a wired communication path and/or a wireless communication path. For example, the data storage device 102 may include an interface 120 (e.g., a host interface) that enables communication using the communication path 110 between the data storage device 102 and the host device 108, such as when the interface 120 is communicatively coupled to the host device 108. In some examples, the host device 108 may provide power to the data storage device 102. For example, the host device 108 may provide one or more regulated voltages to the data storage device 102, such as 12 VDC, 5 VDC, 3.3 VDC, etc.

The host device 108 may include a processor and a memory. The memory may be configured to store data and/or instructions that may be executable by the processor. The memory may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory device 104 of the data storage device 102. For example, the host device 108 may be configured to provide data, such as user data 132, to be stored at the memory device 104 or to request data to be read from the memory device 104. The host device 108 may include a mobile smartphone, a music player, a video player, a gaming console, an electronic book reader, a personal digital assistant (PDA), a computer, such as a laptop computer or notebook computer, any combination thereof, or other suitable electronic device.

The host device 108 communicates using a memory interface that enables reading from the memory device 104 and writing to the memory device 104. In some examples, the host device 108 may operate in compliance with an industry specification, such as a Universal Flash Storage (UFS) Host Controller Interface specification. In other examples, the host device 108 may operate in compliance with one or more other specifications, such as a Secure Digital (SD) Host Controller specification or other suitable industry specification. The host device 108 may also communicate with the memory device 104 in accordance with any other suitable communication protocol.

The memory device 104 of the data storage device 102 may include a non-volatile memory (e.g., NAND, NOR, BiCS family of memories, or other suitable memory). In some examples, the memory device 104 may be any type of flash memory. For example, the memory device 104 may be two-dimensional (2D) memory or three-dimensional (3D) flash memory. The memory device 104 may include one or more memory dies 103. In some of the embodiments, individual memory dies 103 or groups of memory dies 103 may be referred to as arrays. Each of the one or more memory dies 103 may include one or more memory blocks 112 (e.g., one or more erase blocks). Each memory block 112 may include one or more groups of storage elements, such as a representative group of storage elements 107A-107N. The group of storage elements 107A-107N may be configured as a wordline. The group of storage elements 107A-107N may include multiple storage elements (e.g., memory cells that are referred to herein as a "string"), such as a representative storage elements 109A and 109N, respectively.

The memory device 104 may include support circuitry, such as read/write circuitry 140. Although depicted as a single component, the read/write circuitry 140 may be divided into separate components of the memory device 104, such as read circuitry and write circuitry. The read/write circuitry 140 may be external to the one or more memory dies 103 of the memory device 104. Alternatively, one or more individual memory dies 103 may include corresponding read/write circuitry 140 that is operable to read from and/or write to storage elements within the individual memory die, independent of any other read and/or write operations at any of the other memory dies. For example, the read/write circuitry 140 may be configured to perform various read/write operations such as initial writing to volatile memory, array commit functions, and other functions as required for a given application. The memory device 104 may further include one or more latches (e.g., a set of latches 111 including latches 113, 115, and 117).

The data storage device 102 may further include a flash manager 144 and one or more power regulators 146. The flash manager 144 may be configured to control one or more aspects of the memory devices 104. For example, the flash manager 144 may be configured to perform one or more data verification functions. In other examples, the flash manager 144 may perform data verification on all data read from and written to the memory devices 104. The flash manager 144 may further be configured to perform one or more error correction operations, such as cyclic redundancy check ("CRC"), to validate the contents of data processed by the read/write circuitry 140. In one embodiment, the flash manager 144 is further configured to control the operation of the one or more power regulators 146. For example, the flash manager 144 may be configured to switch the power regulators 146 between an ON state and an OFF state. In other examples, the flash manager 144 may be configured to control an output of the power regulators, such as a voltage level output, based on sensed or calculated parameters. While the flash manager 144 of FIG. 1 is shown as independent of the controller 106 and the one or more memory devices 104, in some embodiments, the flash manager 144 may be integrated into the controller 106 and/or the memory device 104. The flash manager 144 may further be configured to interface with the controller 106, the memory device 104, and/or the power regulator 146. For example, the flash manager 144 may communicate with the controller 106 and/or the one or more memory devices using a communication protocol, such as I²C or other suitable communication protocol.

The controller 106 is coupled to the memory device 104 (e.g., the one or more memory dies 103) using a bus 105, an interface (e.g., interface circuitry), another structure, or a combination thereof. For example, the bus 105 may include multiple distinct channels to enable the controller 106 to communicate with each of the one or more memory dies 103 in parallel with, and independently of, communication with the other memory dies 103.

The controller 106 is configured to receive data and instructions from the host device 108 and to send data to the host device 108. For example, the controller 106 may send data to the host device 108 using the interface 120, and the controller 106 may receive data from the host device 108 using the interface 120. The controller 106 is configured to send data and commands (e.g., the memory operation 136, which may be a cycle operation of a memory block of the memory device 104) to the memory device 104 and to receive data from the memory device 104. For example, the controller 106 is configured to send data and a program or write command to cause the memory device 104 to store data to a specified address of the memory device 104. The write command may specify a physical address of a portion of the memory device 104 (e.g., a physical address of a word line of the memory device 104) that is to store the data, as well as a size (e.g. 2 k, 4 k, etc.) of the data to be written.

The controller 106 is configured to send a read command to the memory device 104 to access data from a specified address of the memory device 104. The read command may specify the physical address of a region of the memory device 104 (e.g., a physical address of a word line of the memory device 104), as well as a size (e.g. 2 k, 4 k, etc.) of the data to be read. The controller 106 may also be configured to send data and commands to the memory device 104 associated with background scanning operations, garbage collection operations, and/or wear-leveling operations, or other suitable memory operations.

The controller 106 may include a processor 124, a memory 126, and other associated circuitry. The memory 126 may be configured to store data and/or instructions that may be executable by the processor 124. The memory 126 may include a memory hang mitigation application 130 among other applications, programs, etc. The memory hang mitigation application 130 may be a hardware circuit or instructions that are executable by the processor 124. While shown as being stored in the memory 126, in some examples the memory hang mitigation application 130 may be configured as a circuit within the memory device 104.

The memory hang mitigation application 130 may be configured to execute one or more data hang mitigation operations. For example, the memory hang mitigation application 130 may interface with the flash manager 144 to cycle power to one or more memory dies, as will be described in more detail below. For example, the memory hang mitigation application 130 may be configured to instruct the flash manager 144 to cycle power to one or more of the memory dies 103. While shown as being stored within the memory 126, in some instances the memory hang mitigation application 130 may be integrated within the flash manager 144.

Figure 2:
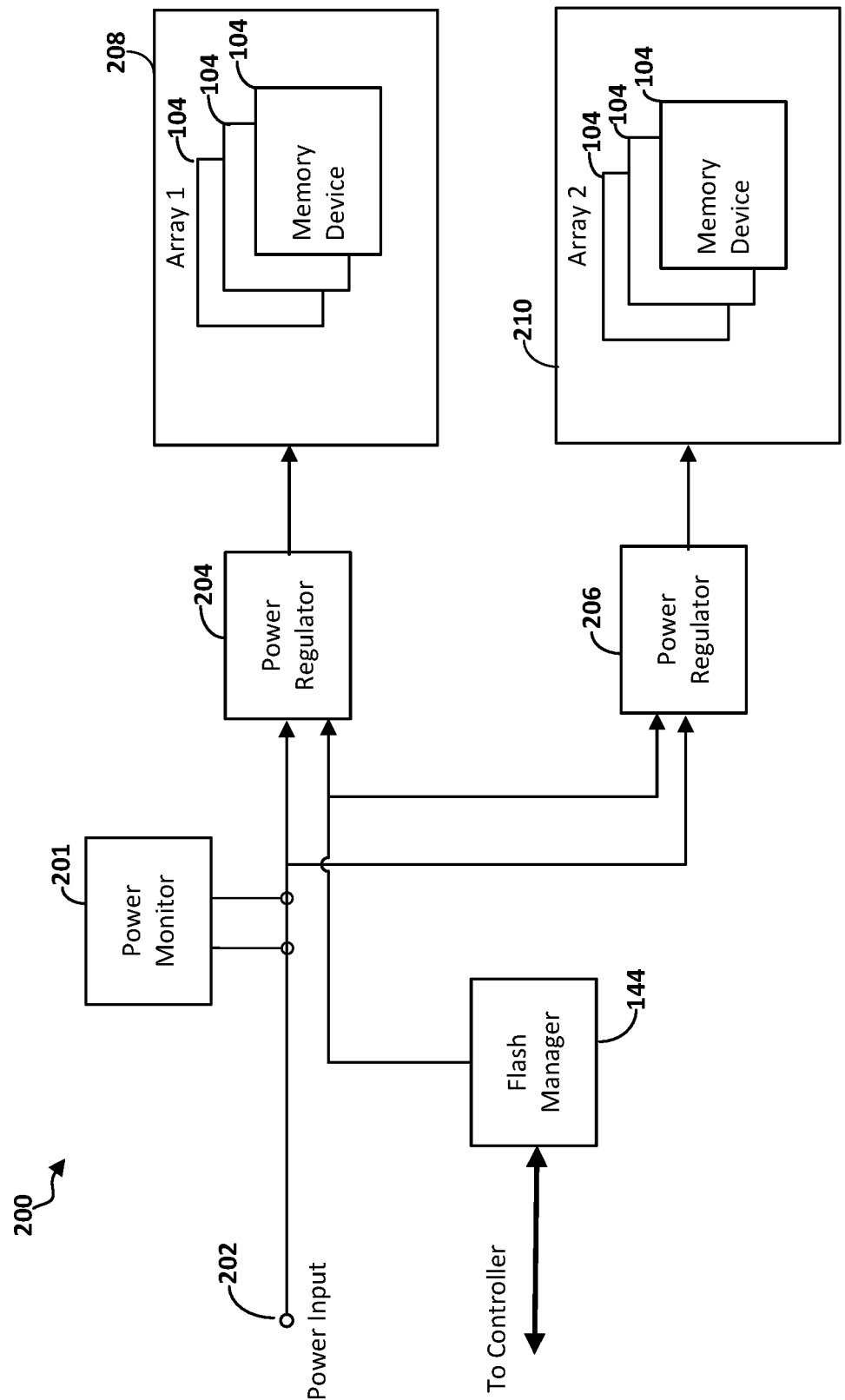
FIG. 2 is a block diagram illustrating one example of a memory of the data storage device of FIG. 1, according to some embodiments.

Turning now to FIG. 2, a block diagram of a power distribution system 200 for a data storage device, such as data storage device 102, is shown, according to some embodiments. The power distribution system 200, includes the flash manager 144, a first power regulator 204, and a second power regulator 206. The power regulators 204, 206 are understood to have similar functionality to the power regulator 146, described above, and may be used interchangeably. The power distribution system 200 further includes a power monitor 201, configured to determine one or more parameters of the power received by the memory devices 104. In one embodiment, the power monitor 201 may detect a power supplied by a power input 202. The power input 202 may be provided by the controller 106, described above. In other embodiments, the power input 202 may be provided by the host device 108 using the host interface 120. The power monitor 201 may determine a current being drawn by the power regulators 204, 206. For example, the power monitor 201 may determine a voltage across a sense resistor (not shown) indicating a current value provided to the power regulators 204, 206. However, other current sensor types are also contemplated. The power monitor 201 may be configured to determine power provided to the power regulators 204, 206 based on one or more sensed or determined parameters, such as those described above. In some examples, the power monitor 201 may communicate with the flash manager 144. The power monitor 201 may communicate the one or more sensed or determined parameters to the flash manager 144, which may in turn determine a power provided to the power regulators 204, 206. In some examples, the flash manager 144 may provide data received from the power monitor 201 to other devices, such as controller 106.

As shown in FIG. 2, each of the first power regulator 204 and the second power regulator 206 may be configured to provide one or more voltages to an associated array. However, in some embodiments, each array may have more than one power regulator associated therewith to provide power for the array. For example, as shown in FIG. 2, the first power regulator 204 provides power to a first array 208, and the second power regulator 206 provides power to a second array 210. The first array 208 and the second array 210 may include one or more memory devices 104, as described above. In one example, the one or more memory devices 104 may include one or more memory dies 103, as described above. While the arrays 208, 210 of FIG. 2 show each array including three memory devices 104, the arrays may have more than three memory devices 104 or fewer than three memory devices 104, as appropriate for a given application. Further, while the example of FIG. 2 shows only two arrays, it is contemplated that a data storage device, such as data storage device 102, may include more than two arrays, and that each array would have an associated power regulator. In some embodiments, the first power regulator 204 supplies one or more voltages to the first array 208. For example, the first power regulator 204 may supply an operating voltage and an input/output ("I/O") voltage to the first array 208. The operating voltage and the I/O voltage may have different voltage levels and/or power capacities. In other examples, the operating voltage and the I/O voltage may have the same voltage level. In some examples, the first power regulator 204 provides approximately 3.2 VDC to the first array 208. However, a voltage output value of more than 3.2 VDC or less than 3.2 VDC are also contemplated. In some examples, the first power regulator 204 may provide a voltage output in a range of 2.5 VDC to 3.3 VDC as an operating voltage, and approximately 1.2 VDC as an I/O voltage. However, I/O voltages of more than 1.2 VDC or less than 1.2 VDC are also contemplated.

Similarly, the second power regulator 206 supplies one or more voltages to the second array 210. For example, the second power regulator 206 may supply an operating voltage and an I/O voltage to the second array 210. The operating voltage and the I/O voltage may have different voltage levels and/or power capacities. In other examples, the operating voltage and the I/O voltage may have the same voltage level. In some examples, the second power regulator 206 provides approximately 3.2 VDC to the first array 210. However, value of more than 3.2 VDC or less than 3.2 VDC are also contemplated. In one embodiment, the first power regulator 204 and the second power regulator 206 are configured to be able to cycle power to their respective arrays 208, 210 based on a received instruction from a controller, such as the flash manager 144.

Figure 3:
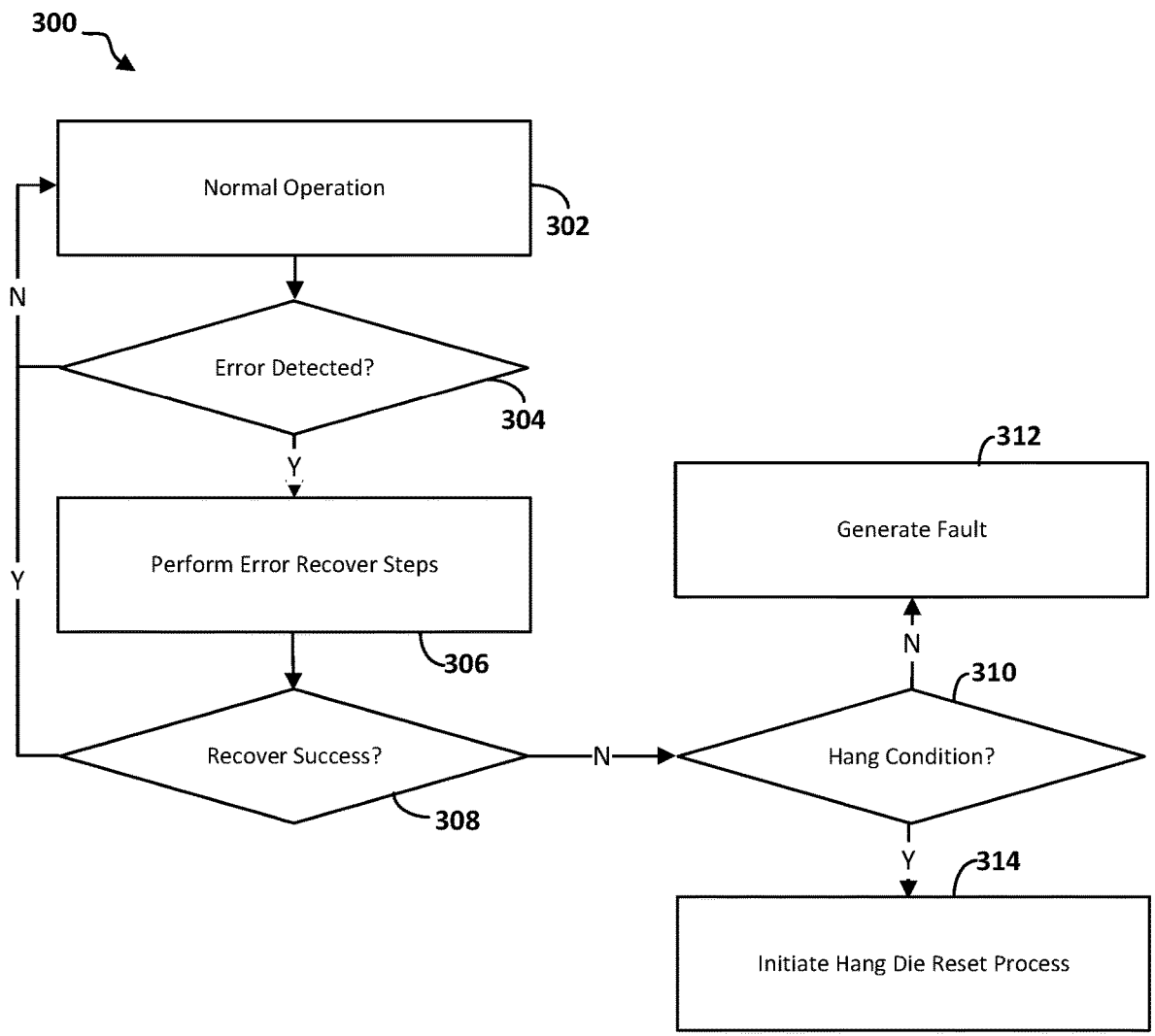
FIG. 3 is a flow chart illustrating an error recovery process, according to some embodiments.

Turning now to FIG. 3, a flow chart illustrating an error recovery process 300 is shown, according to some embodiments. In one embodiment, the process 300 is performed by a controller, such as controller 106. In other embodiments, the process 300 is performed by the flash manager 144. In still further embodiment, the process 300 is performed by a combination of the flash manager 144 and the controller 106. Thus, while the process 300 is described with regards to the flash manager 144 performing the various functions described below, it is contemplated that in some examples the controller 106 may also perform the below described functions. At block 302, the data storage device 102 operates normally. At block 304, the flash manager 144 determines whether an error has been detected on one or more arrays of the data storage device 102. An error may be indicated as an invalid error data, such as a CRC error. In other examples, the error may be a low-density parity-check ("LDPC") error. In still further embodiments, the error may be due to a time out or non-responsive array, such as arrays 208, 210 described above. Non-responsive memory devices 104 within an array may also result in an error being detected. In response to determining that no error has been detected, normal operation resumes at block 302

In response to detecting that an error has occurred, the flash manager 144 performs one or more error recovery steps to recover from the detected error at block 306. Possible error recovery steps may include soft resets of one or more memory devices 104 or arrays, re-reads, low-density parity check ("LDPC") correction XOR based data reconstruction, as well as other error recovery steps as appropriate for a given application. In response to performing the error recovery steps at block 306, the flash manager 144 determines whether the recovery steps were successful at block 308. Recovery of the error may be determined to be successful based on a read or write operation to the array and/or memory device 104, when the error was previously detected being performed successfully. In response to determining that the recovery of the error was successful, normal operation is resumed at block 302. In response to determining that the recovery was not successful, the flash manager 144 determines whether the error is a hang condition (e.g. a non-responsive array or memory die 103), at block 310. In one embodiment, the flash manager 144 determines that the error is a hang condition based on one or more memory devices 104 and/or arrays being non-responsive to read and/or write commands. In other embodiments, a timeout command (e.g. a watchdog or other timeout algorithm) may be used to determine whether the error is a hang condition in response to a timeout timer expiring.

In response to determining that the error is not a hang condition, a fault is generated at block 312. In some examples, the flash manager 144 may provide the generated fault to the controller 106 for communication to a user, such as by the host device 108. In response to determining that the error is a hang condition, a die reset process is performed at block 314. The die reset process is described in more detail below. In one embodiment, the memory hang mitigation application 130 may initiate the die reset process.

Figure 4:
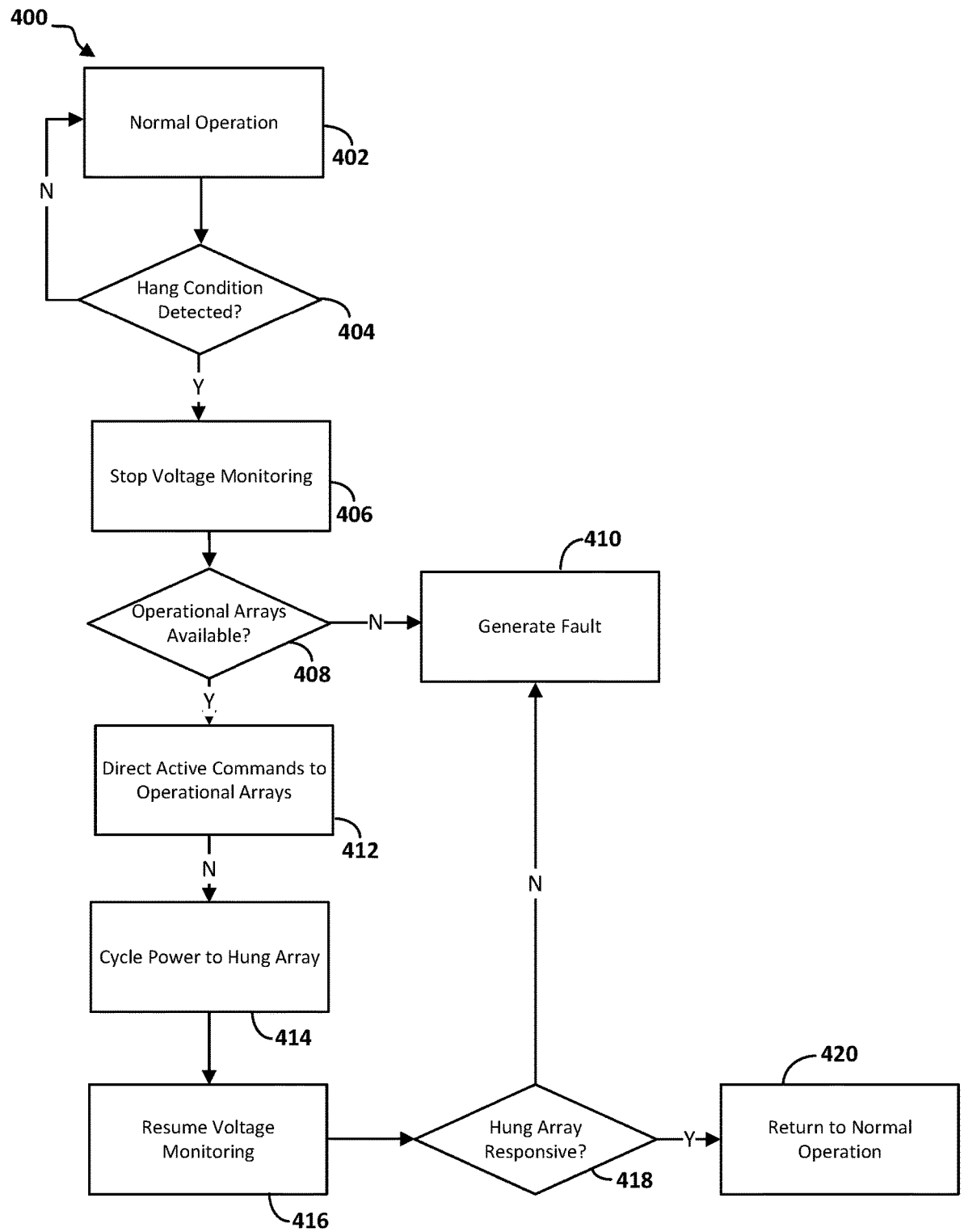
FIG. 4 is a flow chart illustrating a die reset process, according to some embodiments.

Turning now to FIG. 4, a memory device reset process 400 is described, according to some embodiments. In one embodiment, the process 400 is performed by the flash manager 144. However, in other embodiments, other control devices, such as the controller 106 in conjunction with the memory hang mitigation application 130 may perform the process 400. In still further examples, the process 400 may be performed by a combination of the flash manager 144 and the controller 106. Accordingly, while the die reset process 400 is described as being performed with regards to the flash manager 144, in some embodiments other controllers, as described above, may perform some or all of the process 400.

At block 402, the data storage device 102 operates normally. At block 404 the flash manager 144 determines whether a hang condition is detected. The flash manager 144 may determine whether a hang condition is detected as described above in regards to process 300. In response to determining that no hang condition is detected, the data storage device 102 operates normally at block 402. In response to determining that a hang condition has been detected, the flash manager 144 stops voltage monitoring at block 406. For example, the flash manager 144 may instruct the power monitor 201 to stop monitoring a voltage of the power input 202. In one embodiment, the monitoring of voltage is stopped to prevent one or more power level errors from being generated in response to cycling power to one or more arrays 208, 210, as will be described in more detail below. As cycling power may result in power transients (e.g. surges and drops, the power monitor 201 may generate one or more faults during the performance of process 400. Thus, by stopping monitoring of the power input 202, new faults are not generated during and based on the execution of process 400.

At block 408, the flash manager 144 determines whether any arrays 208, 210 of the data storage device 102 are operational. An array, such as arrays 208, 210, may be determined to be operational when there are no memory devices 104 in a hang condition within the associated array. For example, when one or more memory devices 104 within an array 208, 210 are determined to be non-responsive, the array containing the non-responsive memory device(s) 104 is determined to be in a hang condition, and not operational. In response to no arrays being determined to be operational, a fault is generated at block 410. The fault may be generated by the flash manager 144. In some examples, the flash manager 144 may transmit the generated fault to the controller 106 and/or a host device 108. In some examples, the fault may be stored in a memory, such as memory 126 for access by the host device 108.

In response to determining that one or more arrays are operational, the flash manager 144 directs all active commands to the operational array (or arrays) at block 412. In some embodiments, a fault may be generated indicating that one or more of the arrays are non-operational in addition to directing the active commands to the operational arrays at block 412. As one or more arrays are in a hang condition, pending read commands directed to the arrays in the hang condition are reported as failing or unsuccessful. In some embodiments, the flash manager 144 may report any pending read commands unable to be performed due to the hang conditions to the controller 106. However, pending write commands may be redirected to the operational arrays. Furthermore, any additional or new read/write commands may be directed to the operational arrays, when possible.

At block 414, the flash manager 144 cycles power to the one or more arrays determined to be in a hang condition. Cycling power to an array may resolve a hang condition error by clearing out non-responsive state machine and/or analog circuits. In one embodiment, the flash manager 144 cycles power to the one or more arrays in the hang condition by controlling an associated power regulator, such as power regulators 204, 206. In one example, the flash manager 144 controls the power supply by sending an instruction or command to the respective power regulator 204, 206 to cycle the power, such as via one or more of the communication protocols (e.g. I²C) described above. In other embodiments, flash manager 144 may disable the respective power regulator 204, 206 by removing an enable bit or other enabling input such that the power regulator 204, 206, ceases providing power to the respective array 208, 210. The flash manager 144 may then re-enable the respective power regulator 204, 206 and the respective array is powered-up to complete the power cycle. In some example, the duration of the power cycle is 100 μs. In other examples, the duration of the power cycle is 10 μs. However, values of more than 10 μs and less than 10 μs are also contemplated. In some examples, the duration of the power cycle is the time it takes the array to power up once the power has been cycles. During the cycling of power to the one or more arrays determined to be in the hang condition, the flash manager 144 controls the power regulators 204, 206 associated with the operational memory devices 104 to ensure power is maintained to the operational memory devices 104 (e.g. the memory devices 104 not determined to be in the hang condition).

Upon completing the power cycle operation, voltage monitoring is resumed at block 416. At block 418, the flash manager 144 determines whether the one or more arrays 208, 210 previously in a hang condition are responsive after the power cycle. In one embodiment, the flash manager 144 determines the one or more arrays 208, 210 to be responsive after the power cycle when all the memory devices 104 within the respective arrays 208, 210 are responsive to commands from the flash manager 144. In one embodiment, the flash manager 144 may initiate a power-on reset ("POR") routine for the one or more arrays 208, 210 after the power cycle operation. Where the POR routine is successful for an associated array 208, 210, the associated array 208, 210 is determined to be responsive. In response to determining that the one or more arrays 208, 210 are still not responsive (e.g. still in a hang condition), the flash manager 144 generates a fault at block 410. In some examples, wherein only some arrays of the one or more arrays 208, 210 are still not responsive and other arrays of the one or more arrays 208, 210 that were previously non-responsive become responsive after power cycling, a fault is still generated at block 410. In one embodiment, the fault may provide an indication that one or more arrays 208, 210 of the data storage device 102 are not functional and that the data storage device 102 only has use of a portion of the total arrays 208, 210. This information may then be communicated to the controller 106 and subsequently to a user or supervisory controller through the host device 108. For example, when the data storage device 102 is part of an enterprise system, an indication that the data storage device 102 is operating on less than 100% of its available arrays may be sent to an enterprise administrator.

In response to determining that the one or more arrays previously determined to be in a hang condition are now cycled responsive arrays (e.g. no longer in a hang condition), the data storage device 102 returns the cycled responsive arrays to normal operation at block 420. Returning the cycled responsive arrays to normal operation includes allowing the cycled responsive arrays to execute read/write commands provided by the flash manager 144. In one embodiment, the flash manager 144 will redirect active commands previously redirected to responsive arrays 208, 210, at block 412, back to the cycled responsive arrays. In other embodiments, the flash manager 144 resumes directing commands (e.g. read/write commands) back to the cycled responsive arrays. In some examples, the data storage device 102 only returns to normal operation when all arrays are in the responsive condition.

Memory device process 400 allows for power to be cycled to an individual array while operational arrays continue processing commands from the host device 108. This prevents a total loss of operation of the data storage device 102 due to one or more memory devices 104 being in a hang condition. Further, by resetting power to the affected (e.g. hung) memory dies/arrays, the hang condition may be resolved, preventing a complete loss of the data storage device 102.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage device, comprising:
a solid-state memory block including
a plurality of arrays, each array of the plurality of arrays including a plurality of memory devices, wherein each of the plurality of memory devices includes a plurality of memory dies, and
a plurality of power regulators,
wherein each array of the plurality of arrays is coupled to a respective one of the plurality of power regulators; and
a controller configured to:
determine whether a first array of the plurality of arrays is in a non-responsive condition,
instruct a first power regulator of the plurality of power regulators providing power to the first array to cycle power to the first array in response to determining that the first array is in the non-responsive condition,
determine whether the first array is in a responsive condition after cycling power to the first array;
stop monitoring a voltage of a power input to the memory block in response to determining that the first array is in a non-responsive condition; and
resume monitoring the voltage of the power input to the memory block after cycling power to the first array.

2. The data storage device of claim 1, wherein the controller is further configured to:
determine whether a second array of the plurality of arrays is in a responsive condition in response to determining that the first array is in the non-responsive condition, and
redirect one or more active commands from the first array to the second array in response to determining that the second array is in a responsive condition.

3. The data storage device of claim 1, wherein the controller is further configured to control a second power regulator of the plurality of power regulators to maintain power to the second array of the plurality of arrays while the power to the first array is cycled.

4. The data storage device of claim 1, wherein the controller is further configured to:
direct commands to the first array in response to determining that the first array is in the responsive condition.

5. The data storage device of claim 1, wherein cycling power to the first array includes removing power to the first array and causing the first array to restart over a time period.

6. The data storage device of claim 5, wherein the time period is approximately 10 μ seconds.

7. A method performed by a solid-state data storage device having a controller coupled to a non-volatile memory device, the method comprising:
determining whether a first array of a plurality of arrays is in a non-responsive condition, wherein the plurality of arrays include one or more solid-state memory devices;
cycling power to the first array in response to determining that the first array is in the non-responsive condition;
maintaining power to at least a second array of the plurality of arrays while cycling power to the first array;
determining whether the first array is in a responsive condition after cycling power to the first array;
pausing a monitoring of a voltage level of a power input to the non-volatile memory device in response to determining that the first array is in the non-responsive condition; and
resuming the monitoring of the voltage level of the power input to the non-volatile memory device after cycling the power to the first array.

8. The method of claim 7, wherein cycling power to the first array includes instructing a power regulator coupled to the first array to cycle the power.

9. The method of claim 7, further comprising:
determining whether the second array of the plurality of arrays is in a responsive condition in response to determining that the first array is in the non-responsive condition; and
redirecting one or more active commands from the first array to the second array in response to determining that the second array is in a responsive condition.

10. The method of claim 7, wherein cycling power to the first array includes removing power to the first array to cause the first array to restart over a time period.

11. The method of claim 10, wherein the time period is approximately 10 μ seconds.

12. The method of claim 7, further comprising directing commands to the first array in response to determining that the first array is in the responsive condition.

13. An apparatus, comprising:
means for determining whether a first array of a plurality of arrays within a solid-state memory block is in a non-responsive condition, wherein the plurality of arrays include one or more solid-state memory devices;
means for cycling power to the first array in response to determining that the first array is in the non-responsive condition;
means for determining whether the first array is in a responsive condition after cycling power to the first array;
means for pausing a monitoring of a voltage level of a power input to the memory block in response to determining that the first array is in the non-responsive condition; and
means for resuming the monitoring of the voltage level of the power input to the memory block after cycling the power to the first array.

14. The apparatus of claim 13, further comprising means for maintaining power to at least a second array of the plurality of arrays while cycling power to the first array, and wherein the means for cycling power to the first array includes means for instructing a power regulator coupled to the first array to cycle the power.

15. The apparatus of claim 13, further comprising:
means for determining whether the second array of the plurality of arrays is in a responsive condition in response to determining that the first array is in the non-responsive condition; and
means for redirecting one or more active commands from the first array to the second array in response to determining that the second array is in a responsive condition.

16. The apparatus of claim 13, further comprising:
means for directing commands to the first array in response to determining that the first array is in the responsive condition.

17. The apparatus of claim 16, wherein the means for cycling power to the first array includes means for removing power to the first array to cause the first array to restart over a time period.

* * * * *